United States Patent [19]
Babb

[11] Patent Number: 5,483,413
[45] Date of Patent: Jan. 9, 1996

[54] APPARATUS FOR CONTROLLING ELECTROMAGNETIC INTERFERENCE FROM MULTI-LAYERED CIRCUIT BOARDS

[75] Inventor: Samuel M. Babb, Fort Collins, Colo.

[73] Assignee: Hewlett-Packard Company, Palo Alto, Colo.

[21] Appl. No.: 329,138

[22] Filed: Oct. 24, 1994

Related U.S. Application Data

[63] Continuation of Ser. No. 177,705, Jan. 4, 1994, abandoned, which is a continuation of Ser. No. 102,677, Aug. 5, 1993, abandoned, which is a continuation of Ser. No. 661,937, Feb. 28, 1991, abandoned.

[51] Int. Cl.$^6$ ..................................................... H05K 9/00
[52] U.S. Cl. ........................... 361/220; 174/51; 174/35 R; 361/794; 361/818
[58] Field of Search ................................ 361/212, 220, 361/784, 792–795, 818; 174/262, 261, 260, 264, 255, 250, 51, 35 R; 257/659, 728, 724; 333/246, 247; 439/109, 607, 68; 29/837

[56] References Cited

U.S. PATENT DOCUMENTS

| | | | |
|---|---|---|---|
| 4,450,029 | 5/1984 | Holbert et al. | 174/264 |
| 4,670,347 | 6/1987 | Lasik et al. | 174/35 R |
| 4,694,123 | 9/1987 | Massey | 361/795 |
| 4,899,439 | 2/1990 | Potter et al. | 361/414 |
| 4,904,968 | 2/1990 | Theus | 174/250 |
| 5,029,041 | 7/1991 | Robinson et al. | 361/220 |
| 5,043,526 | 8/1991 | Nakagawa et al. | 174/250 |
| 5,043,848 | 8/1991 | Rogers et al. | 361/414 |
| 5,068,631 | 11/1991 | Vince | 174/250 |
| 5,072,075 | 12/1991 | Lee et al. | 361/414 |
| 5,081,563 | 1/1992 | Feng et al. | 361/414 |
| 5,136,471 | 8/1992 | Inasaka et al. | 361/414 |

OTHER PUBLICATIONS

JA 0083396, Abstract, Tsuzumi, Apr. 1991 "Multilayer Printed Circuit Board".
JA 0040452, Abstract, Oyabu, Feb. 1991 "Semiconductor Integrated Circuit Package".

*Primary Examiner*—William M. Shoop, Jr.
*Assistant Examiner*—Richard T. Elms

[57] ABSTRACT

A printed circuit board is shown to include at least one layer formed from electrically insulating material and a power plane formed on the layer. The outer perimeter of the power plane is spaced away from the outer edge of the layer thereby defining an outer area. A conductive structure is formed in the outer area, spaced from and surrounding the power plane and adapted to be connected to ground. Electromagnetic radiation emanating from the power plane is caused to terminate on the conductive structure. A multi-layered printed circuit board can also include a first layer of electrically insulating material, a ground plane formed on the first layer, a second layer of electrically insulating material and a power plane formed on the second layer. The outer perimeter of the power plane is spaced away from the outer edge of the second layer. A conductive structure is formed on the second layer in the outer layer, spaced from and surrounding the power plane, wherein the conductive structure is electrically connected to the ground plane. In an alternate embodiment wherein the power plane and ground plane are formed on opposite sides of the same layer, the thickness of the layer and the distance the power plane is spaced away from the outer edge of the layer are sufficient so that electromagnetic radiation emanating from the power plane is caused to terminate on the ground plane.

8 Claims, 2 Drawing Sheets

APPARATUS FOR CONTROLLING ELECTROMAGNETIC INTERFERENCE FROM MULTI-LAYERED CIRCUIT BOARDS

CROSS REFERENCE TO RELATED APPLICATION

This application is a continuation of prior application Ser. No. 177,705, filed on Jan. 4, 1994, now abandoned, which was a continuation of application Ser. No. 102,677, filed on Aug. 5, 1993, now abandoned, and which was a continuation of application Ser. No. 661,937, filed on Feb. 28, 1991, now abandoned.

FIELD OF THE INVENTION

The present invention relates generally to the control of electromagnetic interference from printed circuit boards and more particularly to the control of electromagnetic interference from multi-layered printed circuit boards wherein metallic conductor structures are formed in desired patterns on each layer of insulating material in such boards.

BACKGROUND OF THE INVENTION

Electromagnetic interference (EMI) is a generic term for unwanted interference energies either conducted as currents or radiated as electromagnetic fields. EMI can emanate from computers or other digital devices in several ways. Generally, voltages and currents in board mounted, integrated switching circuits create electric and magnetic fields that radiate from the device. EMI radiating from such devices will vary in field strength and impedance according to the shape and orientation of the conductors, the distance from the conductors to any shielding provided by circuit components or by coupling to circuit components.

Since most computers operate by generating pulse signals at rates in excess of a million pulses per second, radiating EMI will extend into the radio frequency spectrum and can cause significant interference with radio and television signals. The United States Federal Communications Commission has promulgated rules and procedures requiring the minimization and regulation of EMI by manufacturers. Under such regulations, EMI must be limited for certain devices to particular micro-volt ranges depending on the frequency of the EMI signal.

In lieu of the problems surrounding EMI and the need to comply with government regulations, schemes have been proposed for limiting EMI. One typical scheme has been to provide a conductive enclosure to an electronic device so that EMI field lines will terminate on such enclosure. Unfortunately, if multiple printed circuit boards are contained in the enclosure, EMI emanating from one board can effect the operation of another board within the enclosure.

In the past, designers have constructed multi-layer printed circuit boards in which the so-called power plane is positioned beneath the ground plane in an attempt to limit EMI. Unfortunately, such designs present greater construction complexities, since the leads of devices mounted on the circuit board designed for connection to the power plane and all conductive structures designed for power plane connection must pass through the ground plane.

Consequently, a need exists for controlling EMI emanating from a printed circuit board, whereby multiple printed circuit boards can be installed in a single electronic cabinet without inter-board electromagnetic interference.

SUMMARY OF THE INVENTION

The advantages of the invention are achieved in a printed circuit board including a layer formed from electrically insulating material and a first conductive structure formed on the layer and connected to a power source. The outer perimeter of the conductive structure is spaced away from the outer edge of the layer thereby defining an outer area. A second conductive structure is formed in the outer area, spaced from and surrounding the first conductive structure, and connected to ground. Electromagnetic radiation emanating from the first conductive structure is caused to terminate on the second conductive structure. The multi-layered printed circuit board, can also include a first layer of electrically insulating material, a first conductive structure formed on the first layer and connected to ground, a second layer of electrically insulating material, and a second conductive structure formed on the second layer and connected to a power source. The outer perimeter of the second conductive structure is spaced away from the outer edge of the second layer. A third conductive structure is formed on the second layer in the outer area, spaced from and surrounding the second conductive structure, wherein the third conductive structure is electrically connected to the first conductive structure. In an alternate embodiment, the layer of electrically insulating material, formed on the first conductive structure, and the second conductive structure formed on the layer and connected to a power source is spaced a distance away from the outer edge of the layer. The thickness and distance are sufficient so that electromagnetic radiation emanating from the second conductive structure is caused to terminate on the first conductive structure.

BRIEF DESCRIPTION OF THE DRAWINGS

The present invention will be better understood, and its numerous objects and advantages will become apparent to those skilled in the art, by reference to the following detailed description of the invention when taken in conjunction with the following drawings, in which.

DETAILED DESCRIPTION

Figure 1:
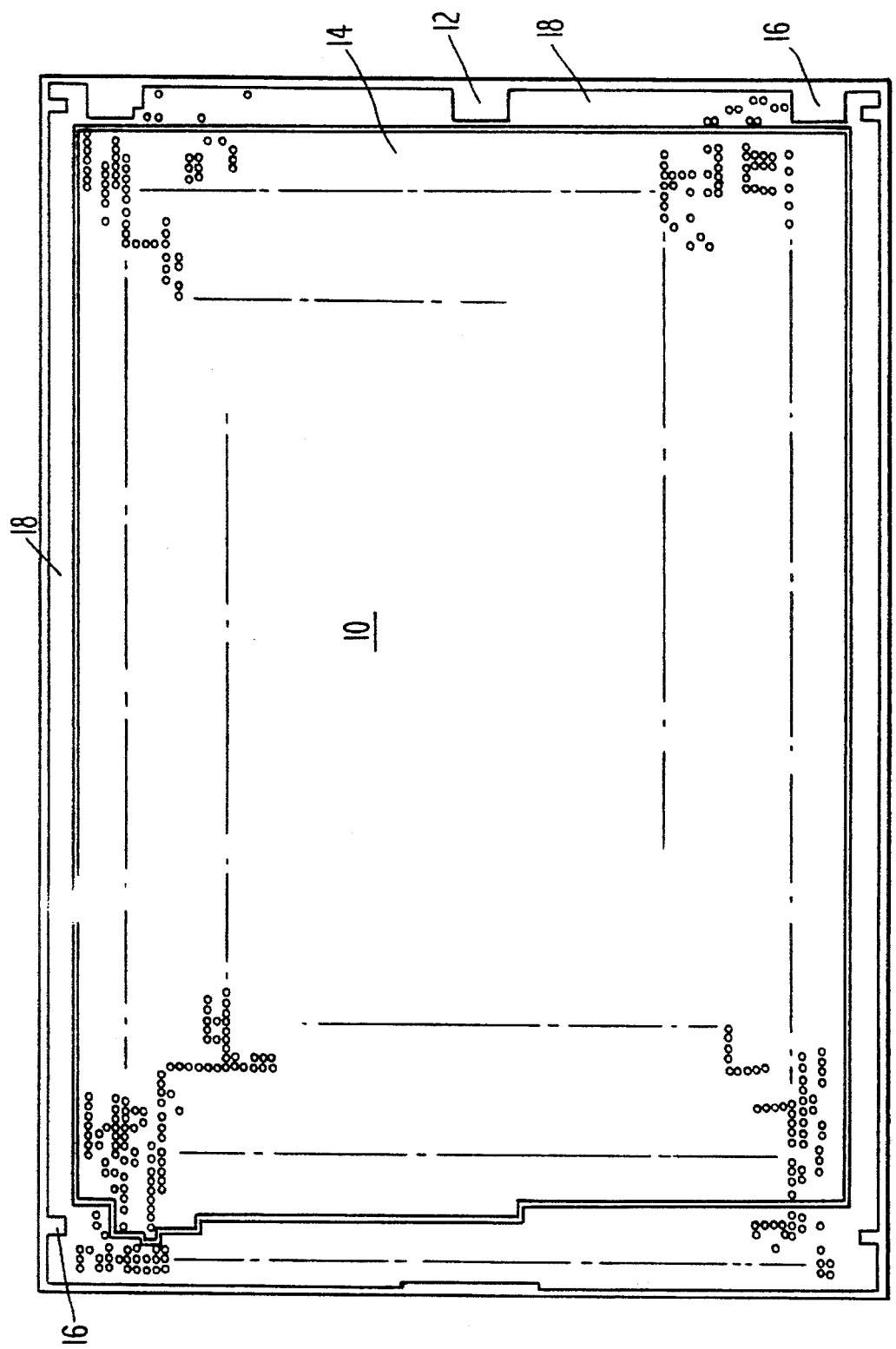
FIG. 1 is a plan view of a printed circuit board constructed in accordance with the present invention.

A new and novel multi-layered printed circuit board is shown in FIG. 1 and generally designated 10. It should be noted that FIG. 1 depicts the power plane being formed on the surface of the printed circuit board, a situation which will rarely occur. In actuality other circuit board layers will be formed on top of the layer depicted in FIG. 1.

Circuit board 10 is shown to include a layer 12 formed from electrically insulating material. In the preferred embodiment, the electrically insulating material is glass. A first conductive structure 14 is formed on layer 12 and adapted to be connected to a power source (not shown). Conductive structure 14 is the power plane. The outer perimeter of conductive structure 14 is spaced away from the outer edge of layer 12 thereby defining an outer area 16. A second conductive structure 18 is formed on layer 12 in outer area 16. Conductive structure 18 is shown to be spaced from and surrounding conductive structure 14. Conductive structure 18 is adapted to be connected to ground. When circuit board 10 is in operation, i.e., conductive structure 14 is connected to a power source and conductive structure 18 is connected to ground, electromagnetic radiation emanating from conductive structure 14 is caused to terminate on conductive structure 18. It will be appreciated from FIG. 1 that conductive structure 18 completely surrounds, i.e., is continuous without any breaks, around conductive structure 14.

Figure 2:
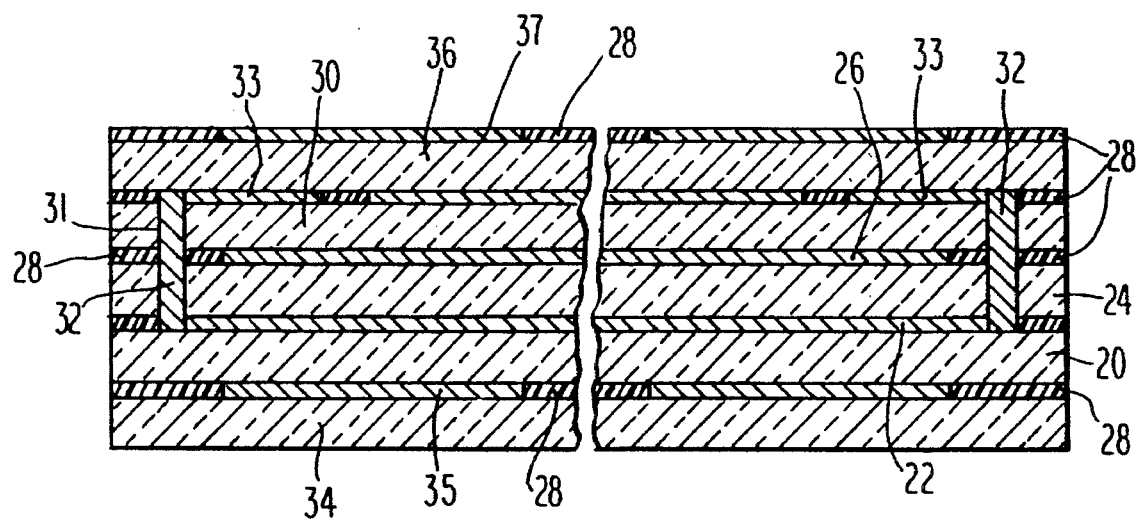
FIG. 2 is a section view of an alternate embodiment of the printed circuit board shown in FIG. 1.

In the preferred embodiment, circuit board 10 is a multi-layered circuit board. As shown in FIG. 2, insulating layer 20 has a conductive structure 22 formed thereon. It will be appreciated that FIG. 2 is an enlarged section view of a multi-layer circuit board. Conductive structure 22 is adapted to be connected to ground; i.e. conductive structure 22 is the ground plane. An additional layer 24 of insulating material is formed on conductive structure 22. An additional conductive structure 26 is formed on layer 24 and is adapted for connection to a power source. Conductive structure 26 is the power plane. Conductive structure 26 transmits electrical power signals to various of the components (not shown) mounted on printed circuit board 10. Conductive structure 26 can be formed into discreet electrical paths or can be formed as a relatively continuous plane.

In order to prevent signals on particular conductive structures from crossing over to adjacent conductive structures, insulating material 28 is deposited on layer 24. As will be seen in FIG. 2, insulating material 28 is also deposited between electrical paths formed on other layers in order to prevent the cross over phenomena. Insulating material 28 can be of any known electrically insulating material and can be deposited in any known manner. Insulating layer 30 is thereafter formed over conductive structure 26.

It will be recalled that conductive structure 22 is adapted to be connected to ground. As shown in FIG. 2, a series of bores 31 are formed through layers of the printed circuit board passing through layers 24 and 30. Conductive material 32 is deposited in the bores 31, in any known manner, which material makes a direct electrical contact with conductive structure 33 and conductive structure 22. In this manner, conductive structure 33 is electrically connected to conductive structure 22 and thus connected to ground. Additional layers 34 and 36 are also shown in FIG. 2 as having conductive structures 35 and 37 formed thereon. It will be appreciated that the number of layers incorporated in any particular printed circuit board is a matter of choice and does not effect the scope of the invention.

As will be appreciated from FIG. 2, conductive structure 22 is substantially co-extensive with layer 20. If printed circuit board 10 is utilized for the mounting of integrated circuit elements thereon, conductive structure 26 defines a power plane, while conductive structure 22 defines a ground plane. Since conductive structure 33 is connected to ground, any electromagnetic radiation emanating from conductive structure 26 will terminate on conductive structure 18.

Figure 3:
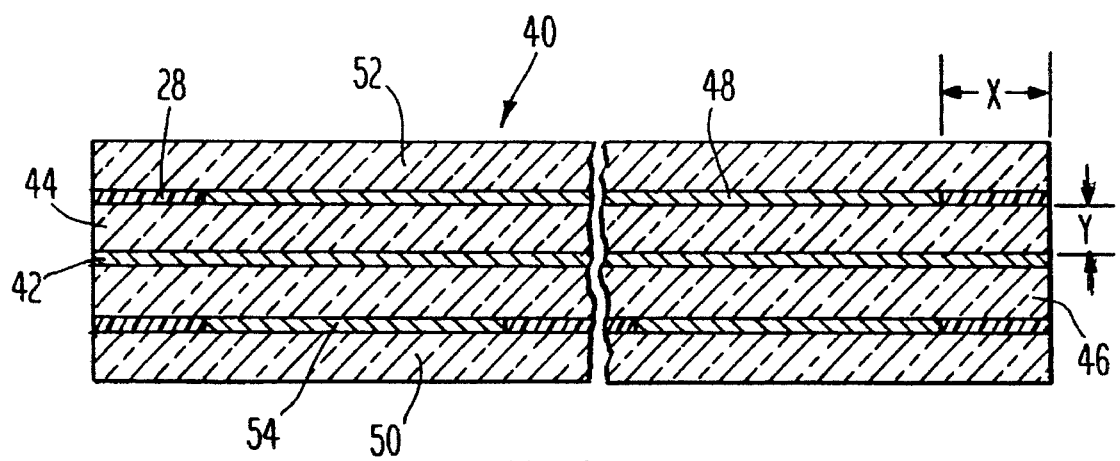
FIG. 3 is a section view of a further alternate embodiment of a circuit board constructed in accordance with the present invention.

An alternative embodiment of the present invention is depicted in FIG. 3. A multi-layered printed circuit board 40 is shown to include a first conductive structure 42, which conductive structure is adapted to be connected to ground. A layer of electrically insulated material 44 is formed on conductive structure 42, which layer is shown to have a thickness Y. Circuit board 40 is also shown to include an additional insulating layer 46 formed on the opposite side of conductive structure 42. An additional conductive structure 48 is formed on layer 44 and adapted to be connected to a power source. The outer perimeter of structure 48 is spaced a distance X away from the outer edge of layer 44. Insulating material 28 is deposited in the outer perimeter. Additional layers 50 and 52 are also shown in FIG. 2 and has conductive structure 54 formed thereon. It will again be appreciated that the number of layers incorporated in any particular printed circuit board is a matter of choice and does not effect the scope of the invention.

In operation, conductive structure 48 is connected to a power source (not shown) and conductive structure 42 is connected to ground. Distance X and thickness Y are selected so that electromagnetic radiation emanating from conductive structure 48 is caused to terminate on conductive structure 42. Although the actual values assigned to X and Y will vary dependent upon the electrical properties of the insulating layer 44, the values of distance and thickness should always maintain the relationship where $Y<X$. As X increases, i.e., as X becomes greater than Y, the electromagnetic radiation emanating from conductive structure 48 more readily terminates conductive structure 42. In the preferred embodiment X is ten (10) times greater than X. It will be noted that thickness Y can be any thickness presently used in the construction of a multi-layered printed circuit board to separate the power plane from the ground plane.

It will be appreciated by those skilled in the art that the conductive structures described herein can be formed in any known method of providing a foil pattern to a multiple layer printed circuit board.

While the invention has been described and illustrated with reference to specific embodiments, those skilled in the art will recognize that modification and variations may be made without departing from the principles of the invention as described herein above and set forth in the following claims.

We claim:

1. A printed circuit board, comprising:

a layer formed from electrically insulating material;

a power plane formed on said layer, the outer perimeter of said power plane being spaced away from the outer edge of said layer so as to define an outer area; and a conductive structure, formed on said layer in said outer area, adjacent to and surrounding said power plane, and connected to ground so as to cause electromagnetic radiation emanating from said power plane to be terminated on said conductive structure.

2. The printed circuit board of claim 1, wherein said power plane defines a plane and wherein said conductive structure is formed to completely surround said power plane within said plane.

3. A multi-layered printed circuit board, comprising:

a first layer of electrically insulating material;

a ground plane formed on said first layer;

a second layer of electrically insulating material formed on said ground plane;

a power plane formed on said second layer, the outer perimeter of said power plane being spaced away from the outer edge of said second layer so as to define an outer area; and a conductive structure, formed on said second layer in said outer area, adjacent to and surrounding said power plane, and electrically connected to said ground plane so as to cause electromagnetic radiation emanating from said power plane to be terminated on said conductive structure.

4. The printed circuit board of claim 3, wherein said second layer has bores formed therethrough in said outer area and further comprising electrically conductive material positioned within said bores so that an electrical connection is formed between said conductive structure and said ground plane.

5. The printed circuit board of claim 3, wherein said ground plane is substantially co-extensive with said first layer.

6. The printed circuit board of claim 3, wherein said power plane defines a plane and wherein said conductive structure completely surrounds said power plane within said plane.

7. A multi-layered printed circuit board having a surface on which electronic devices are to be mounted, comprising:

a ground plane;

a layer of electrically insulating material, formed on and covering an entire surface of said ground plane; and a power plane formed on said layer and positioned closer to said surface than said ground plane, the outer perimeter of said power plane being spaced a distance away from the outer edge of said layer, wherein a thickness of said layer and said distance are sufficient so that electromagnetic radiation emanating from said power plane is caused to terminate on said ground plane.

8. The printed circuit board of claim 7, wherein said thickness is less than said distance.

* * * * *